United States Patent
Schweizer et al.

(10) Patent No.: US 12,074,531 B2
(45) Date of Patent: Aug. 27, 2024

(54) CONVERTER SYSTEM

(71) Applicant: ABB Schweiz AG, Baden (CH)

(72) Inventors: Mario Schweizer, Rütihof (CH); Ivan Furlan, Brissago (CH); Nicola Notari, Gentilino (CH)

(73) Assignee: ABB Schweiz AG, Baden (CH)

( * ) Notice: Subject to any disclaimer, the term of this patent is extended or adjusted under 35 U.S.C. 154(b) by 253 days.

(21) Appl. No.: 17/840,790

(22) Filed: Jun. 15, 2022

(65) Prior Publication Data
US 2022/0407430 A1 Dec. 22, 2022

(30) Foreign Application Priority Data

Jun. 17, 2021 (EP) .................................... 21180063

(51) Int. Cl.
*H02M 1/08* (2006.01)
*H02M 5/458* (2006.01)
*H03L 7/08* (2006.01)

(52) U.S. Cl.
CPC ............ *H02M 5/458* (2013.01); *H02M 1/08* (2013.01); *H03L 7/08* (2013.01)

(58) Field of Classification Search
CPC ........ H02M 5/458; H02M 1/08; H02M 7/217; H03L 7/08
See application file for complete search history.

(56) References Cited

U.S. PATENT DOCUMENTS

2011/0295437 A1* 12/2011 Lu ..................... H02P 9/007
                                                           700/297
2014/0049233 A1    2/2014 Rodríguez Cortés et al.
(Continued)

FOREIGN PATENT DOCUMENTS

EP    3376627 A1    9/2018
EP    3832829 A1    6/2021
(Continued)

OTHER PUBLICATIONS

Beck et al., "Virtual Synchronous Machine," *IEEE 9th International Conference on Electrical Power Quality and Utilisation*, pp. 1-6 (Oct. 9-11, 2007).
(Continued)

*Primary Examiner* — Jue Zhang
*Assistant Examiner* — Afework S Demisse
(74) *Attorney, Agent, or Firm* — Leydig, Voit & Mayer, Ltd.

(57) ABSTRACT

A converter system includes a rectifier, a DC link stage and an inverter connected in series. A control unit includes a slow reference frame angle determination unit that generates a slow reference frame angle $\theta_{r,slow}$ representing an angle that is slowly following a grid phase deviation, and a fast Phase Locked Loop generating a fast reference frame angle $\theta_{r,fast}$ representing an angle that is fast following a grid phase deviation. The control unit uses the slow reference frame angle $\theta_{r,slow}$ and the fast reference frame angle $\theta_{r,fast}$ to control the rectifier output current, and the fast reference frame angle $\theta_{r,fast}$ to control the inverter output voltage and to synchronize the inverter output voltage with the grid voltage.

20 Claims, 4 Drawing Sheets

(56) References Cited

U.S. PATENT DOCUMENTS

2015/0365031 A1* 12/2015 Wessels .................. H02J 3/18
290/44
2021/0173423 A1* 6/2021 Rosso ..................... H02J 3/38

FOREIGN PATENT DOCUMENTS

| WO | WO 2017/036517 A1 | 3/2017 |
| WO | WO 2017/125067 A1 | 7/2017 |

OTHER PUBLICATIONS

Bevrani et al., "Virtual Synchronous Generators: A Survey and New Perspectives," *International J. of Electrical Power and Energy Systems (IJEPES)*, 54(2014): 244-254 (Jan. 2014).

D'Arco et al., "Virtual Synchronous Machines—Classification of Implementations and Analysis of Equivalence to Droop Controllers for Microgrids," *IEEE Grenoble Conference*, 7 pp. (Jun. 16-20, 2013).

De Brabandere et al., "A Voltage and Frequency Droop Control Method for Parallel Inverters," *IEEE Transactions on Power Electronics*, 22(4): 1107-1115 (Jul. 9, 2007).

Shi et al., "Unified Control Scheme design for both the PWM Rectifier and the Inverter in the Uninterruptible Power Supply (UPS) System," *IEEE 3rd International Future Energy Electronics Conference and ECCE Asia (IFEEC 2017—ECCE Asia)*, pp. 1462-1467 (Jun. 3-7, 2017).

European Patent Office, Extended European Search Report in European Application No. 21180063.6, 10 pp. (Dec. 8, 2021).

* cited by examiner

CONVERTER SYSTEM

CROSS-REFERENCE TO RELATED APPLICATIONS

This patent application claims priority to European Patent Application No. 21180063.6, filed on Jun. 17, 2021, which is incorporated herein its entirety by reference.

FIELD OF THE DISCLOSURE

The present disclosure relates to a converter system, a control unit for a converter system and a usage of such a control unit in an uninterruptible power supply (UPS) system.

BACKGROUND OF THE INVENTION

UPS systems comprise a rectifier stage, a DC link stage, and an inverter stage. In case of an outage on a grid side, a DC source that is connected via a booster to the DC link stage is activated. A synchronous machine would try to equalize at least partly the effect of the outage. In the UPS, the current for the equalization is provided by the battery. The effect is emulated by a virtual synchronous machine that has an inertia, and the rectifier current is controlled such that the necessary current can be provided by the battery. Therefore, a virtual synchronous machine may be used for providing the inertia. On the other side, a bypass connects the grid with the load. To switch the bypass on and off without generating harmonics and disturbances, the two sides at the connection points of the bypass have to be synchronized. However, the inertia follows a slow process whereas the synchronization should be a fast process.

BRIEF SUMMARY OF THE INVENTION

There may be a desire to provide an improved UPS system. In the present disclosure, the problem is solved by the subject-matter of the independent claims. Embodiments are provided by the dependent claims, the following description and the accompanying figures.

The described embodiments similarly pertain to the converter system, the control unit for a converter system and a usage of such a control unit in an uninterruptible power system. Synergetic effects may arise from different combinations of the embodiments although they might not be described in detail.

Technical terms are used by their common sense. If a specific meaning is conveyed to certain terms, definitions of terms will be given in the following in the context of which the terms are used.

In this disclosure, for some operations the term "calculated" is used. This term relates to the mathematical background of the operations. However, the implementation may be realized with digital and/or analog circuits. That is, a mathematical operation may be realized also by analog devices. Vice versa, terms as "generated" may comprise generating, for example, a voltage or a current, using analog components or digitally by the use of, for example, a processor.

According to one aspect of the present disclosure, a converter system is provided comprising a rectifier, a DC link stage, an inverter, and a control unit. The rectifier is configured to receive a grid voltage. The DC link stage is configured to receive an output voltage of the rectifier and to provide a DC link voltage for the inverter. The inverter is configured to receive the DC link voltage from the DC link stage and to generate an output voltage. The rectifier, the DC link stage, and the inverter are connected in series. The control unit comprises a slow reference frame angle determination unit, configured to generate a slow reference frame angle $\theta_{r,slow}$ representing an angle that is slowly following a grid phase deviation and a fast PLL (phase locked loop), configured to generate a fast reference frame angle $\theta_{r,fast}$ representing an angle that is fast following a grid phase deviation. The control unit is configured to use the slow reference frame angle $\theta_{r,slow}$ and the fast reference frame angle $\theta_{r,fast}$ to control the rectifier output current, and to use the fast reference frame angle $\theta_{r,fast}$ to control the inverter output voltage and to synchronize the inverter output voltage with the grid voltage.

BRIEF DESCRIPTION OF THE SEVERAL VIEWS OF THE DRAWING(S)

DETAILED DESCRIPTION OF THE INVENTION

In the description that follows, corresponding parts are provided with the same reference symbols in all figures.

Figure 1:
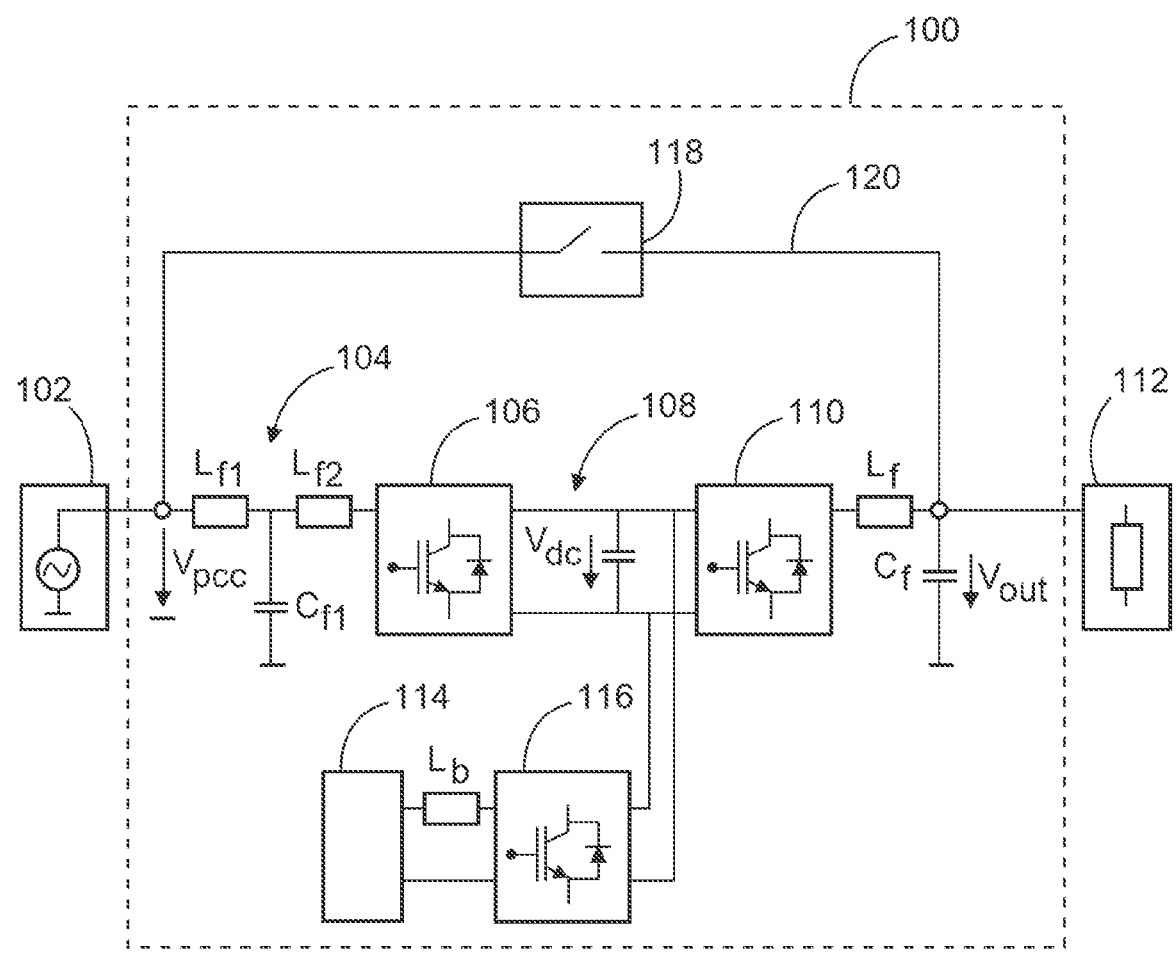
FIG. 1 shows a block diagram of a converter system according to an embodiment of the present disclosure.

FIG. 1 shows a block diagram of a converter system 100. The converter system comprises a rectifier 106 that is coupled on the input side to a power grid 102 and a filter 104 with inductances $L_{f1}$ and $L_{f2}$ and capacitor $C_r$. The converter system 100 further comprises a DC-link 108 and an inverter 110 such that the converter system 100 represents a double conversion system. The DC link is further coupled to a battery 114 through battery booster 116. The inverter output is coupled through output filter $L_f$, $C_f$ to a critical load 112. A bypass 120 with bypass switch 118 may bypass the rectifier-converter chain 104, 106, 108, 110 and be connected to the power grid 102 on one end and to the critical load 112 on the other end. The converter system 100 may be a UPS, which shall provide reliably power to the critical load 112. For this, it has two mechanisms. The first mechanism is the bypass, which is disengaged, for example, when frequency fluctuations occur, and the other mechanism is retracting power from the battery, for example, when an outage on grid-side occurs. The mechanisms can work individually or in combination.

Figure 2:
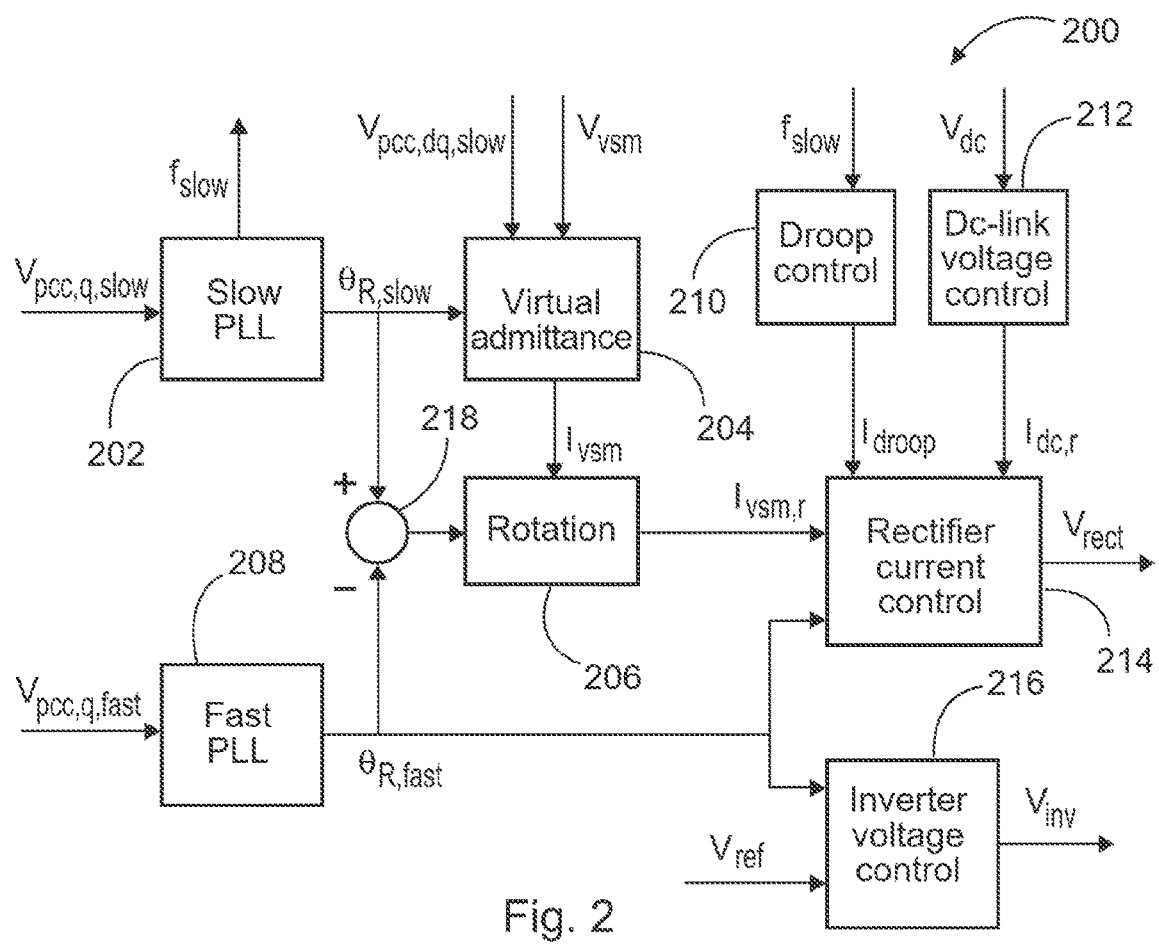
FIG. 2 shows a block diagram of a control unit according to an embodiment of the present disclosure.

FIG. 2 shows a block diagram of a control unit 200 for controlling the converter system 100.

The circuit comprises a slow reference frame angle determination unit 202, here, a slow PLL 202 that provides a slow reference phase angle $\theta_{R,slow}$ to a virtual admittance 204. $\theta_{R,slow}$ is used to transform the voltage into a slow reference frame. The virtual admittance 204 receives $V_{pcc}$ and the virtual source machine voltage $V_{vsm}$ as input and acts as current source that outputs virtual source machine current $I_{vsm}$. Thus, the slow PLL 202 and the virtual admittance 204 form a grid-forming vector current control (GFVCC) system.

The control unit 200 further comprises a fast PLL 208 that provides a fast reference phase angle $\theta_{R,fast}$ to adder 218 that subtracts $\theta_{R,fast}$ from $\theta_{R,slow}$. $\theta_{R,fast}$ is further used to transform the voltage into a fast reference frame. The result of the adder 218 is used to rotate $I_{vsm}$ such that the reference current $I_{vsm,r}$ for the rectifier virtual generator equivalent current reference is transformed into the fast PLL reference frame. As result, the reference current $I_{vsm,r}$ is obtained. The rectifier current control unit 214 receives further currents such as $I_{droop}$ and $I_{dc,r}$, that may contribute to a total current, and $\theta_{R,fast}$ for generating or calculating the control voltage $V_{rect}$ of the rectifier 106 for controlling the rectifier current. The part of the control unit 200 described above emulates the effect of a virtual synchronous generator operated in parallel with a virtual current source by means of the slow PLL 202 and the virtual admittance 204 that provides its output current $I_{vsm}$ to the adder 218. The slow PLL 202 has a low bandwidth to match the virtual inertia effect of a synchronous machine such that it reacts slowly on grid angle and grid frequency changes. The fast PLL 208 has a high bandwidth that allows a fast grid frequency estimate and ensures the synchronization of the grid voltage with the inverter output voltage. The fast reference phase $\theta_{R,fast}$ is provided to the rectifier control unit 214 and to the inverter voltage control unit 216.

The individual blocks of the control unit 200 will be described in more detail in the following.

The slow PLL unit 202 and the virtual admittance block 204 are key components of the grid forming vector current control (GFVCC) algorithm. With special tuning rules for the gains of the slow PLL 202 and the virtual admittance block 104, the combination of both creates current references that are equivalent to the current of a virtual synchronous generator (VSM).

The slow PLL unit 202 generates a slow reference frame angle and a slow grid frequency estimate according to $$\omega_{r,slow} = \left(K_{pll,p} + \frac{K_{pll,i}}{s}\right) \cdot V_{pcc,q,slow}$$

$$\frac{d\theta_{r,slow}}{dt} = \omega_{r,slow}, \text{ and } f_{Slow} = \frac{\omega_{r,slow}}{2\pi}.$$

The slow PLL 202 gains are set according to $$K_{pll,p} = \frac{K_f}{MV_{pcc}}, K_{pll,i} = c_P \frac{V_{vsm}}{MX_v},$$

where M denotes the virtual inertia constant, $K_f$ the damper winding constant, $X_v = \omega_N L_v$ the virtual reactance, $V_{vsm}$ the amplitude of the back-emf (electromotive force) of the virtual generator and $c_p$ the power coefficient ($c_p = 3/2$ in three-phase systems and peak vales). The specific tuning leads to a low bandwidth of the slow PLL 202 with rather low damping. $V_{pcc,d,slow}$ and $V_{pcc,q,slow}$ are calculated with the Park transformation using the slow reference frame angle $\theta_{r,slow}$ and the three phase quantities of the PCC voltage $V_{pcc,abc}$. Index d refers to the direct component of the Park transformed parameters, index q to the quadrature component, and index r to a reference parameter. The virtual admittance unit 204 is defined according to $$Y_v = \begin{bmatrix} \frac{R_v + s \cdot L_v}{R_v^2 + 2L_v R_v s + L_v^2(s^2 + \omega_N^2)} & \frac{\omega_N L_v}{R_v^2 + 2L_v R_v s + L_v^2(s^2 + \omega_N^2)} \\ \frac{-\omega_N L_v}{R_v^2 + 2L_v R_v s + L_v^2(s^2 + \omega_N^2)} & \frac{R_v + s \cdot L_v}{R_v^2 + 2L_v R_v s + L_v^2(s^2 + \omega_N^2)} \end{bmatrix}$$

where the index "v" is chosen for "virtual" and $\omega_n$ is a nominal angle velocity, e.g. $2\pi$ 50 Hz.

The virtual synchronous generator equivalent current references may be calculated as:

$ivsm,d = Yv,dd(s) \cdot (Vv - Vpcc,d,slow) + Yv,dq(s) \cdot (-Vpcc,q,slow)$ $ivsm,q = Yv,qd(s) \cdot (Vv - Vpcc,d,slow) + Yv,qq(s) \cdot (-Vpcc,q,slow),$ where index dd is the first column and first row positon of the matrix $Y_v$, etc.

The second, "fast PLL" 208 is running in parallel and calculates a fast reference frame angle and a fast grid frequency estimate according to $$\omega_{r,fast} = \left(K_{pll,p,2} + \frac{K_{pll,i,2}}{s}\right) \cdot V_{pcc,q,fast}$$

$$\frac{d\theta_{r,fast}}{dt} = \omega_{r,fast}$$

$$f_{fast} = \frac{\omega_{r,fast}}{2\pi}.$$

The PI controller gains of the fast PLL 208 may be chosen such that the bandwidth of the fast PLL is 2 to 10 times higher compared to the bandwidth of the slow PLL 202. $V_{pcc,d,fast}$ and $V_{pcc,q,fast}$ are calculated with the Park transformation using the fast reference frame angle $\theta_{r,fast}$ and the phase quantities of the PCC voltage $V_{pcc,abc}$. Before the virtual generator equivalent current references can be used in the fast PLL reference frame, they need to be rotated by the rotation unit 206 according to $\Delta\theta = \theta r,slow - \theta r,fast$ $ivsm,r,d = \cos(\Delta\theta)ivsm,d - \sin(\Delta\theta)ivsm,q$ $ivsm,r,q = \cos(\Delta\theta)ivsm,q + \sin(\Delta\theta)ivsm,d$ Now, the additional active current reference components coming from the DC-link voltage control unit 212 and an optional frequency droop control unit 210 for frequency regulation can be added to current reference components from the virtual admittance 204.

$i_d^* = i_{vsm,r,d} + i_{dc,r} + i_{droop,r}$ $i_q^* = i_{vsm,r,q}$

The DC-link voltage control unit 212 typically is of PI-type and controls the DC-link voltage to its nominal value and creates an active power equivalent current reference idc,r. The droop control unit 210 typically is a P-type control block with piecewise linear characteristics. The input value is the measured grid frequency $f_{slow}$, the output value is an active power equivalent current reference $i_{droop,r}$. Due to the usage of the fast PLL reference frame, the DC-link voltage control and droop control current components are accurately aligned to the d-direction of the PCC voltage and therefore directly control active power flow. No reactive power is injected.

In a final step, the power injected by the virtual synchronous generator part 202, 204 of the rectifier control scheme could be used in a feedforward term for the battery booster current control $$P_{vsm,ff} = \frac{3}{2} \cdot (V_{pcc,d,slow} \cdot i_{vsm,d} + V_{pcc,q,slow} \cdot i_{vsm,q})$$

Alternatively, the quantities in the fast reference frame can be used $$P_{vsm,ff} = \frac{3}{2} \cdot (V_{pcc,d,fast} \cdot i_{vsm,r,d} + V_{pcc,q,fast} \cdot i_{vsm,r,q})$$

If the optional droop control unit 210 is required, additionally the corresponding equivalent power should be considered as well in the feedforward term for the battery booster 116

$$P_{vsm,ff} = \frac{3}{2} \cdot (V_{pcc,d,fast} \cdot (i_{vsm,r,d} + i_{droop,r}) + V_{pcc,q,fast} \cdot i_{vsm,r,q})$$

The reference for the battery booster current is calculated as $$i_{batt,ff} = \frac{P_{vsm,ff}}{V_{batt}}.$$

Typically, the controller for the battery booster 116 is of PI-type and controls the battery current to follow a given reference.

Finally, the inverter output voltage control unit 216 is described. In general, it will control the output voltage $V_{out}$ to follow a given reference:

$$V_{out,d}* = V_N$$

$$V_{out,q}* = 0$$

$$\theta = \theta_{r,fast}$$

The references for the phase quantities $V_{out,abc}$ are calculated with the inverse Park transformation using the references in dq-reference frame and the fast PLL angle $\theta_{r,fast}$. By doing so, accurate synchronization of the inverter output voltage with the grid input voltage is ensured. The phase difference is minimized, and the bypass switch 118 can be operated safely in steady-state as well as in transient situations.

The rectifier current control unit 214 as well as the inverter output voltage control unit 216 can be implemented with any control method (PID/PI/P classic control, cascaded-control, state-feedback control, model-predictive control) and in any reference frame (synchronous reference frame (dq), stationary reference frame (αβ), stationary phase-oriented reference frame (abc)). The invention described in this document is not restricting the type of control.

Figure 3:
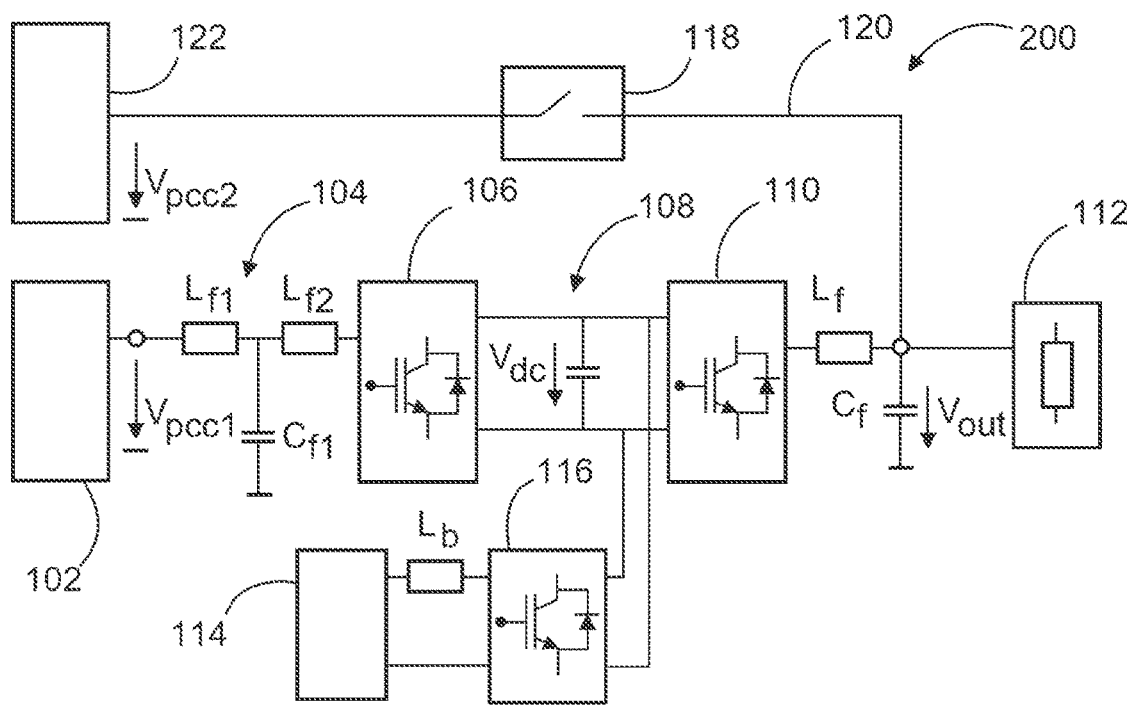
FIG. 3 shows a block diagram of the converter system according to a second embodiment of the present disclosure.

FIG. 3 shows a block diagram of a double-conversion UPS system with dual-infeed. Some UPS systems are configured with a double infeed structure. The bypass switch 118 is connected to a separate grid connection, e.g. an individual transformer or a second AC voltage bus with individual protection for redundancy reasons. In this case, the output voltage of the inverter stage has to be controlled to be in phase with the voltage of the second infeed 122. The proposed control solution is therefore adapted accordingly.

Figure 4:
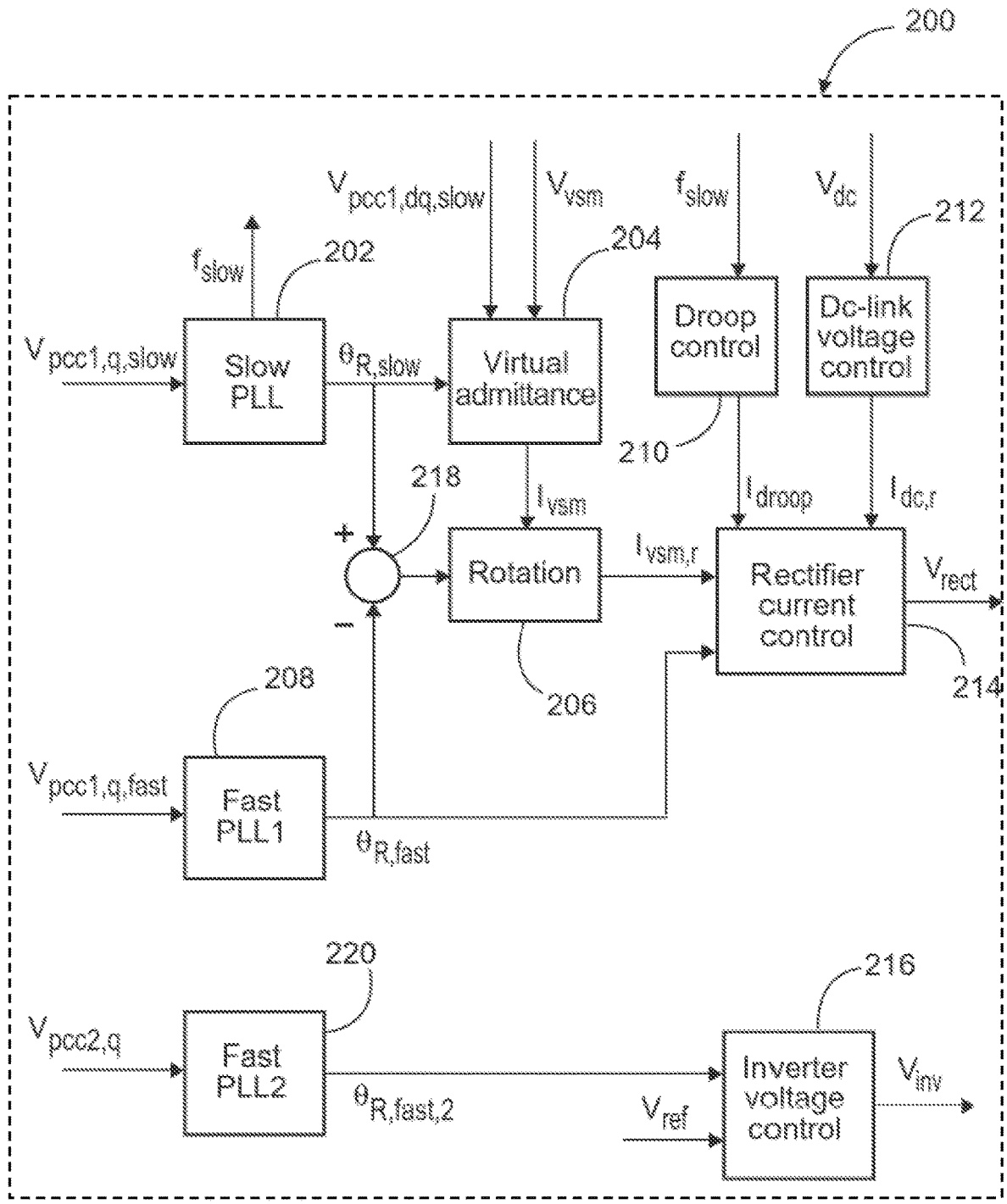
FIG. 4 shows a block diagram of a control unit according to the second embodiment of the present disclosure.

FIG. 4 shows a schematic block diagram of a proposed control solution for dual-infeed UPS systems. The tuning of the control scheme for the rectifier 106 is the same as described above. However, the inverter output voltage is controlled with the angle determined with "Fast PLL 2" 220 such that the inverter output voltage is synchronized with the second infeed 122.

Figure 5:
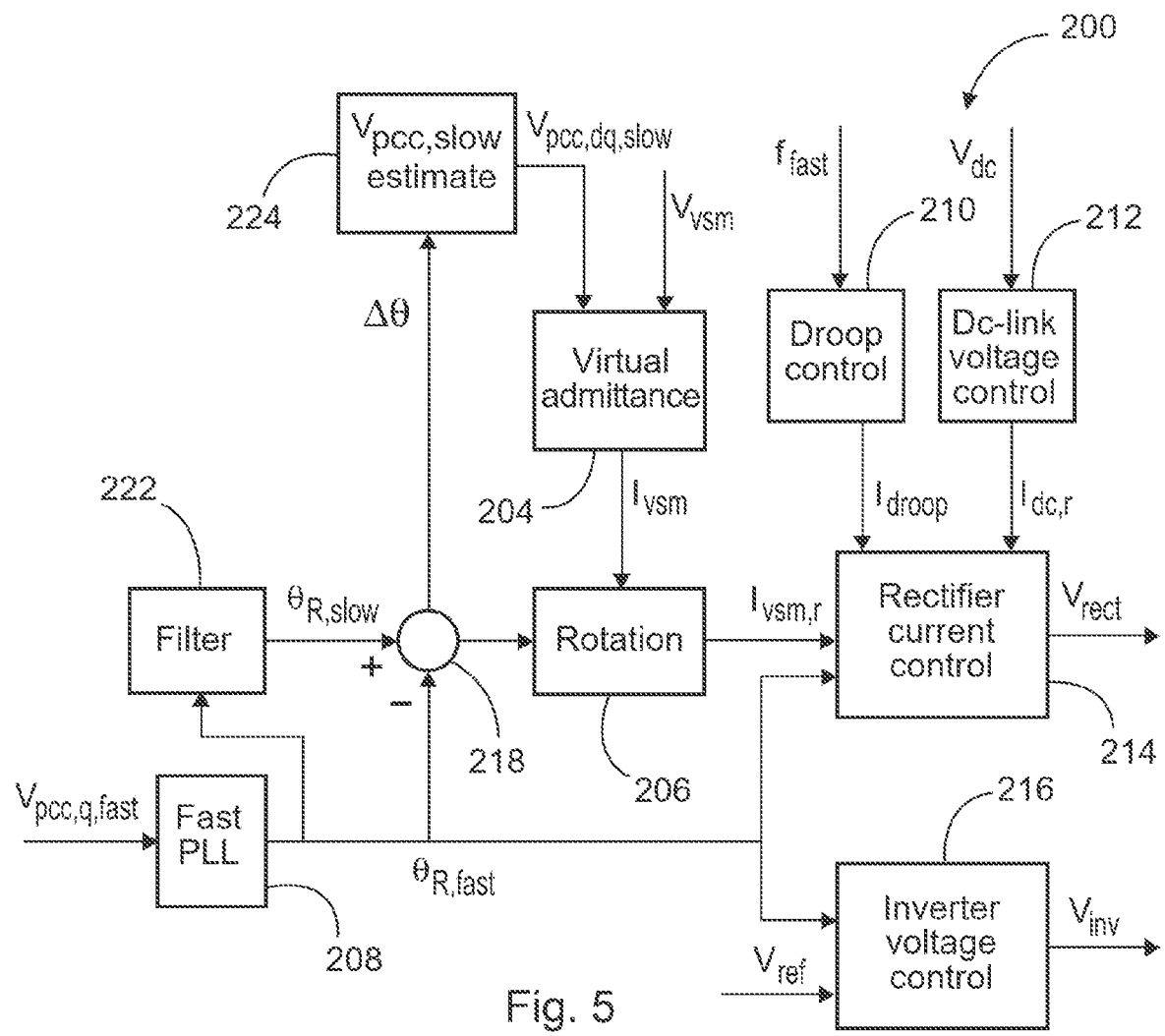
FIG. 5 shows a block diagram of an alternative control unit according to an embodiment of the present disclosure.

Another approach is to use a fast PLL 208 and a second order filter 222 on the estimated grid angle according to FIG. 5. The second order filter 222 is parametrized as follows:

$$\theta_{r,slow} = -\frac{\frac{1}{K_1}s^2}{\frac{1}{K_1}s^2 + K_2 s + 1} \cdot \theta_{r,fast}.$$

Assuming the fast PLL 208 can track the grid voltage angle immediately, the parameters K1 and K2 can be selected to achieve equivalency with the inertia effect of the original slow PLL 202.

$$K_1 = V_{pcc}K_{pll,i} = c_P \frac{V_{pcc}V_{vsm}}{MX_v}, \quad K_2 = \frac{K_{pll,p}}{K_{pll,i}} = \frac{K_f X_v}{c_P V_{pcc} V_{vsm}}$$

Subsequently, the grid voltage estimate 224 used for the virtual admittance 204 is reconstructed with the difference Δθ of the filtered angle θr,slow and the fast angle θr,fast according to $$\Delta\theta = \theta r, slow - \theta r, fast V_{pcc,d,slow} = 1 - \frac{1}{2}\Delta\theta^2$$

$$V_{pcc,q,slow} = -\Delta\theta^2.$$

It is assumed that the grid voltage amplitude is constant, only grid voltage angle shifts will be detected. In the steady-state, no reactive power will be injected because grid voltage amplitude changes are not detected. This might be beneficial in certain applications, such as grid connected UPS.

Figure 6:
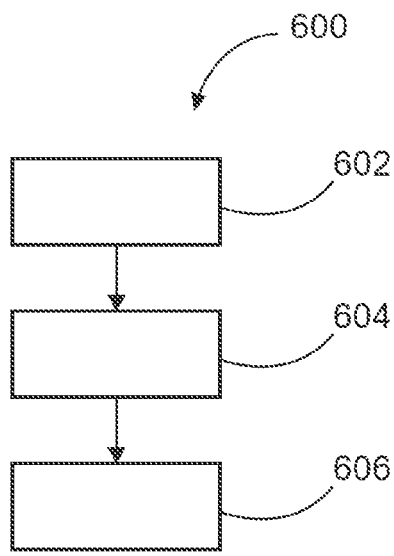
FIG. 6 shows a flow diagram of a method according to the second embodiment of the present disclosure.

FIG. 6 shows a block diagram of a method 600 for controlling the converter system 100 comprising the following steps: In a first step 602, a fast reference frame angle $\theta_{r,fast}$ representing an angle that is fast following a grid phase deviation is generated. In a second step 604, a slow reference frame angle $\theta_{r,slow}$ representing an angle that is slowly following a grid phase deviation is generated. In a third step 606, the slow reference frame angle $\theta_{r,slow}$ and the fast reference frame angle $\theta_{r,fast}$ are used to control the rectifier output current, and the fast reference frame angle $\theta_{r,fast}$ are used to control the inverter output voltage and to synchronize the inverter output voltage with the grid voltage.

Therefore, a combination of grid-forming vector current control with a second, fast PLL 208 and reference frame transformations is provided.

Other variations to the disclosed embodiments can be understood and effected by those skilled in the art in practicing the claimed invention, from the study of the drawings, the disclosure, and the appended claims. In the claims, the word "comprising" does not exclude other elements or steps and the indefinite article "a" or "an" does not exclude a plurality. A single processor or other unit may fulfill the functions of several items or steps recited in the claims. The mere fact that certain measures are recited in mutually different dependent claims does not indicate that a combination of these measures cannot be used to advantage. A computer program may be stored/distributed on a suitable medium such as an optical storage medium or a solid-state medium supplied together with or as part of other hardware, but may also be distributed in other forms, such as via the Internet or other wired or wireless telecommunication systems. Any reference signs in the claims should not be construed as limiting the scope of the claims.

In one embodiment, apart from the control unit, the converter system has a typical architecture, known from, e.g., UPS systems. Between the connection point of the power grid and the rectifier stage, there may be a filter circuit, such as an LC filter, an LCL filter, or another filter type. The DC link may be a simple DC bank or a split DC link. In such a converter system, there may be the need to provide a virtual inertia in case of outages or major grid disturbances to avoid sudden changes in the converter system and in the network. That is, the converter system may compensate the outage or major grid disturbance at least for a certain time and shall provide a smooth transition to the new network conditions. As the expression "inertia" indicates, this transition process shall be smooth and slow. For that, a slow reference frame angle $\theta_{r,slow}$ is determined that follows the phase deviations of the grid voltage slowly. Examples how to determine this angle are given below. The term "reference frame" relates to a co-rotating coordinate system, where θr may be seen as an integrated angle rate (deviation) over time starting from a nominal grid frequency and related phase. That is, the rotation is defined by the instantaneous phase angle consisting of the nominal phase and the integrated phase deviations.

The reference frame angles $\theta_{r,slow}$ and $\theta_{r,fast}$ may be used directly as control parameters to generate control voltages used to control the rectifier output current and the inverter voltage or by additional steps. Regarding the control of the rectifier output current, $\theta_{r,slow}$ and $\theta_{r,fast}$ may be interconnected by a mathematical operation.

According to an embodiment, the slow reference frame angle determination unit is a slow PLL, wherein the slow PLL has a smaller bandwidth than the fast PLL.

"Slow PLL" is understood to be a PLL with smaller bandwidth compared to a "fast PLL". Due to the small or "narrow" bandwidth, the PLL follows frequency changes with a delay. Further, it may have a PI-structure, such the integrating term may cause a "slow" reaction.

According to an embodiment the slow reference frame angle determination unit is configured to derivate the slow reference frame angle $\theta_{r,slow}$ from the fast reference frame angle $\theta_{r,fast}$.

This embodiment avoids the need of a slow PLL. Further, the reference frame angles are related to each other and filters may be implemented that define the relation. Such a filter may be a low pass filter or a filter comprising integrating elements, etc. Alternatively, a combination with a slow PLL would be possible.

According to an embodiment, the control unit is configured to transform the grid voltage $V_{pcc}$ into a slow reference frame voltage $V_{pcc\ slow}$, wherein the transformation is a Park transformation using the slow reference frame angle $\theta_{r,slow}$, and to transform the grid voltage $V_{pcc}$ into a fast reference frame voltage $V_{pcc\ fast}$, wherein the transformation is a Park transformation using the fast reference frame angle $\theta_{r,fast}$.

The reference frame voltage $V_{pcc\ slow}$ is used to calculate a virtual synchronous machine reference current $I_{VSM,r}$ wherein the virtual synchronous machine reference current $I_{VSM,r}$ is a further component for controlling rectifier output current and the fast reference frame voltage $V_{pcc\ fast}$ is a further component for controlling the inverter output voltage.

The Park transformation is also known as direct-quadrature-zero (DQZ, d/q- or dq) transformation, and is a tensor that rotates the reference frame of a three-element vector or a three-by-three element matrix. The transformation can be used to rotate the reference frames of AC waveforms such that they become DC signals. Simplified calculations can then be carried out on these DC quantities before performing the inverse transform to recover the actual three-phase AC results.

As mentioned above, the fast and the slow reference frames are defined by the reference frame angles $\theta_{r,slow}$ and $\theta_{r,fast}$. The DQ components of $V_{pcc}$, namely $V_{pcc,\ d}$ and $V_{pcc,\ q}$, are obtained applying the Park transformation to $V_{pcc}$ based on these reference frame angles. Further, a virtual synchronous machine reference current $I_{VSM}$ is calculated According to an embodiment, the virtual synchronous machine reference current $I_{VSM,r}$ is obtained by applying a virtual admittance to the slow reference frame voltage $V_{pcc\ slow}$ resulting in a virtual synchronous machine current $I_{VSM}$ and by rotating the virtual synchronous machine current $I_{VSM}$ by an angle difference between $\theta_{r,slow}$ and $\theta_{r,fast}$.

The slow reference frame angle determination unit and the virtual admittance represent together a virtual synchronous machine. The virtual synchronous machine provides the virtual synchronous machine reference current $I_{VSM}$ that is generated using virtual inertia elements, e.g. a PI controller with inertia constant. It is reminded that the internally generated voltages and currents, such as $I_{VSM}$ are bound to a specific reference frame. $I_{VSM}$ is generated by the VSM and therefore related to the slow reference frame. The currents and voltages of the slow or fast reference frames comprise d and q components. By the rotation, the amounts of the d and q components of $I_{VSM}$ are deferred against each other.

According to an embodiment, the converter system comprises further an inverter voltage control unit configured to calculate an output voltage $V_{inv}$ for controlling the inverter output voltage, wherein the output voltage $V_{inv}$ is controlled to an input reference voltage $V_{ref}$ and to the reference frame angle $\theta_{r,fast}$.

That is, the inverter voltage control unit is responsible for generating the inverter control voltage $V_{inv}$. The input parameters are a fixed reference voltage $V_{ref}$ and the fast reference frame angle $\theta_{r,fast}$. These parameters may also be configurable.

According to an embodiment, the inverter voltage control unit is further configured to perform the inverse Park transformation of the inverter output voltage $V_{inv}$ using the fast reference frame angle $\theta_{r,fast}$.

By doing so, accurate synchronization of the inverter output voltage with the grid input voltage is ensured. The phase difference is minimized, and the bypass switch can be operated safely in steady-state as well as in transient situations.

According to an embodiment, the slow reference frame angle determination unit is further configured to output a slow frequency $f_{slow}$ being the time derivate of $\theta_{r,slow}$, and the converter system further comprises a droop control unit configured to generate a current $I_{droop}$ from $f_{slow}$ and $\theta_{r,slow}$, where $I_{droop}$ is an additional input current component to generate the output voltage $V_{rect}$ for controlling the rectifier current.

The droop control unit is an optional additional component for frequency regulation. It may be implemented for example preferably as a P-controller, or as a PI-, or a similar controller. The input is $f_{slow}$ and the output with respect to the rectifier current control is a reference current component $I_{droop}$ that is added to the d-component of the rotated reference current, $I_{VSM,r}$.

According to an embodiment, the control unit further comprises a DC link voltage control unit configured to generate a current $I_{dc,r}$ from the DC link voltage $V_{dc}$, and $I_{dc\_r}$ is an additional input current component to generate the output voltage $V_{rect}$ for controlling the rectifier current.

The DC link voltage control unit is a further component that can be used to provide an additional component for controlling the rectifier current. The DC link voltage control unit may be implemented for example as a PI- or a similar controller. The input is a reference voltage $V_{dc}$ and the output is a reference current component $I_{dc,r}$ that is added to the d-component of the rotated reference current, $I_{VSM,r}$.

According to an embodiment, the converter system further comprises a switchable bypass, wherein a first end of the bypass is connected to a first infeed and a second end of the bypass is connected to a load, and the rectifier is connected to the first infeed, and the first infeed is a power grid infeed.

The term "infeed" relates to an infeed of the grid voltage $V_{pcc}$. The switch of the bypass may be implemented as a relay, such as a semiconductor or another suitable device. The connection of the rectifier to the first infeed may be over a filter, such as a LCL filter.

By controlling the rectifier current, and with respect to the bypass especially also the inverter voltage in the way described herein, it is possible to synchronize the first and the second ends such that a bypass can be added and switched without generating harmonics and disturbances.

According to an embodiment, alternatively to the previous embodiment, the converter system comprises a switchable bypass, wherein the bypass is connected to a second infeed and a second end of the bypass is connected at a common connection point to a load. The rectifier, the DC link and the inverter are connected to the first infeed on one end and to the load at the common connection point at a second end. The converter system comprises a further fast PLL. The slow reference frame angle determination unit and the fast PLL are connected to the first infeed and used for controlling the rectifier current, and the further fast PLL is connected to the second infeed and used for controlling the inverter voltage.

The first infeed and the second infeed are separate power grid infeeds with voltages $V_{pcc1}$ and $V_{pcc2}$. It is noted that both $V_{pcc1}$ and $V_{pcc2}$ may be three-phase voltages.

In this embodiment, the bypass is connected to a separate infeed providing a grid voltage $V_{pcc2}$. Since the bypass needs a frequency and phase synchronization, the further (second) fast PLL is used to generate the according inverter control voltage, whereas for the rectifier current control an arrangement as described above is used, with the difference that there is no connection between the (first) fast PLL and the inverter voltage control unit.

Embodiments described herein enable having a bypass without generating harmonics and disturbances. Switching the bypass on and off without such unwanted effects is possible when the two ends are synchronized to each other. Therefore, a bypass may be added to the converter system that can be switched while the ends are synchronized.

According to an embodiment, the converter system comprises a DC source and a DC source booster, wherein the control unit is further configured to provide a DC source booster reference current $i_{batt,ff}$ by determining a virtual synchronous machine feedforward power based on the virtual synchronous machine reference current $I_{VSM,r}$ and slow reference frame voltage $V_{pcc\_slow}$ and $V_{batt}$.

The battery provides the current for the virtual synchronous machine, when the virtual inertia gets active. The voltage for loading the battery and for supplying the energy, e.g. in case of an outage of other grid components, is controlled by the booster. The current required for the virtual inertia is determined by the rectifier current control unit.

According to an embodiment, the converter system is a UPS system.

According to a further aspect, a control unit for a converter system described herein is provided. The control unit may be a hardware unit, a software unit, or both. It may comprise the units to provide the functionality for the control of the rectifier and the inverter as described above and in the description of the figures. It further may comprise units to control the battery booster and/or the bypass switch.

Further, a method may be provided to control a converter system comprising the steps: generating a slow reference frame angle $\theta_{r,slow}$ representing an angle that is slowly following a grid phase deviation, generating a fast reference frame angle $\theta_{r,fast}$ representing an angle that is fast following a grid phase deviation, using the slow reference frame angle $\theta_{r,slow}$ and the fast reference frame angle $\theta_{r,fast}$ to control the rectifier output current, and using the fast reference frame angle $\theta_{r,fast}$ to control the inverter output voltage and to synchronize the inverter output voltage with the grid voltage.

The order of the steps of the method may be varied. For example, the step of generating a slow reference frame angle $\theta_{r,slow}$ may be performed after the step of generating a fast reference frame angle $\theta_{r,fast}$.

Furthermore, a program element may be provided, which when being executed by the control unit, instructs the converter system to perform the steps of the method. The program element may be part of a computer program, but it can also be an entire program by itself. For example, the program element may be used to update an already existing computer program to get to the present invention.

The control unit may comprise circuits without programmable logics or may be or comprise a micro control unit, a field programmable gate array (FPGA), an ASIC, a Complex Programmable Logic Devices (CPLD), or any other programmable logic devices known to person skilled in the art.

Furthermore, a computer readable medium on which such a program element is stored may be provided. The computer readable medium may be seen as a storage medium, such as for example, a USB stick, a CD, a DVD, a data storage device, a hard disk, or any other medium on which a program element as described above can be stored.

According to a further aspect, a usage of such a control unit in a UPS is provided.

The preceding figures illustrate embodiments of the invention. These and other features, aspects and advantages of the present invention will become better understood with reference to the accompanying figures and the foregoing description.

LIST OF REFERENCE NUMERALS

- 100 converter system
- 102 power grid
- 104 filter
- 106 rectifier
- 108 DC-link
- 110 inverter
- 112 critical load
- 114 battery
- 116 battery booster
- 118 bypass switch
- 120 bypass
- 122 second infeed
- 200 control unit
- 202 slow reference frame angle determination unit; slow PLL
- 204 virtual admittance
- 206 rotation unit
- 208 (first) fast PLL
- 210 droop control unit
- 212 DC-link voltage control unit
- 214 rectifier current control unit
- 216 inverter output voltage control unit
- 218 adder
- 220 second fast PLL
- 222 filter
- 224 Vpcc dq slow estimate block
- 600 method for controlling the converter system
- 602 first step of the method
- 604 second step of the method
- 606 third step of the method All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A converter system, comprising:
    a rectifier configured to receive a grid voltage;
    a DC link stage configured to receive an output voltage of the rectifier and to provide a DC link voltage for an inverter;
    wherein the inverter is configured to receive the DC link voltage from the DC link stage, and to generate an output voltage, and wherein the rectifier, the DC link stage and the inverter are connected in series; and
    a control unit, the control unit comprising:
        a slow reference frame angle determination unit configured to generate a slow reference frame angle $\theta_{r,slow}$ representing an angle that is slowly following a grid phase deviation; and
        a fast Phase Locked Loop, PLL, configured to generate a fast reference frame angle $\theta_{r,fast}$ representing an angle that is fast following a grid phase deviation;
    wherein the control unit is further configured to use the slow reference frame angle $\theta_{r,slow}$ and the fast reference frame angle $\theta_{r,fast}$ to control a rectifier output current, and to use the fast reference frame angle $\theta_{r,fast}$ to control the inverter output voltage and to synchronize the inverter output voltage with the grid voltage.

2. The converter system according to claim 1, wherein the slow reference frame angle determination unit is a slow PLL, and wherein the slow PLL has a smaller bandwidth than the fast PLL.

3. The converter system according to claim 1, wherein the slow reference frame angle determination unit is configured to derivate the slow reference frame angle $\theta_{r,slow}$ from the fast reference frame angle $\theta_{r,fast}$.

4. The converter system according to claim 1, wherein the control unit is configured to:
    transform the grid voltage $V_{pcc}$ into a slow reference frame voltage $V_{pcc\ slow}$, wherein the transformation is a Park transformation using the slow reference frame angle $\theta_{r,slow}$; and
    transform the grid voltage $V_{pcc}$ into a fast reference frame voltage $V_{pcc\ fast}$, wherein the transformation is a Park transformation using the fast reference frame angle $\theta r,fast$; and
    wherein the slow reference frame voltage $V_{pcc\ slow}$ is used to calculate a virtual synchronous machine reference current $I_{VSM,r}$;
    wherein the virtual synchronous machine reference current $I_{VSM,r}$ is a further component for controlling rectifier output current; and
    wherein the fast reference frame voltage $V_{pcc\ fast}$ is a further component for controlling the inverter output voltage.

5. The converter system according to claim 4, wherein the virtual synchronous machine reference current $I_{VSM,r}$ is obtained by applying a virtual admittance to the slow reference frame voltage $V_{pcc\ slow}$ resulting in a virtual synchronous machine current $I_{VSM}$ and by rotating the virtual synchronous machine current $I_{VSM}$ by an angle difference between $\theta_{r,slow}$ and $\theta_{r,fast}$.

6. The converter system according to claim 4, further comprising a DC source and a DC source booster, wherein the control unit is further configured to provide a DC source booster reference current $i_{batt,ff}$ by determining a virtual synchronous machine feedforward power based on the virtual synchronous machine reference current $I_{VSM,r}$ and slow reference frame voltage $V_{pcc\ slow}$ and $V_{batt}$.

7. The converter system according to claim 1, further comprising an inverter voltage control unit configured to calculate an output voltage $V_{inv}$ for controlling the inverter output voltage, wherein the output voltage $V_{inv}$ is controlled to an input reference voltage $V_{ref}$ and to the reference frame angle $\theta_{r,fast}$.

8. The converter system according to claim 7, wherein the inverter voltage control unit is further configured to perform the inverse Park transformation of the inverter output voltage $V_{inv}$ using the fast reference frame angle $\theta_{r,fast}$.

9. The converter system according to claim 1, wherein the slow reference frame angle determination unit is further configured to output a slow frequency $f_{slow}$ being the time derivate of $\theta_{r,slow}$, and wherein the converter system further comprises a droop control unit configured to generate a current $I_{droop}$ from $f_{slow}$ and $\theta_{r,slow}$, and $I_{droop}$ is an additional input current component to generate the output voltage $V_{rect}$ for controlling the rectifier current.

10. The converter system according to claim 1, wherein the control unit further comprises a DC link voltage control unit configured to generate a current $I_{dc\_r}$ from the DC link voltage $V_{dc}$, and $I_{dc\_r}$ is an additional input current component to generate the output voltage $V_{rect}$ for controlling the rectifier current.

11. The converter system according to claim 1, wherein the converter system further comprises a switchable bypass having a first end and a second end, wherein the first end is connected to a first infeed and the second is connected to a load, and wherein the rectifier is connected to the first infeed, and the first infeed is a power grid infeed.

12. The converter system according to claim 1, wherein:
the converter system further comprises a switchable bypass (120);
the bypass is connected to a second infeed and a second end of the bypass is connected at a common connection point to a load;
the rectifier, the DC link and the inverter are connected to the first infeed on one end and to the load at the common connection point at a second end;
the converter system comprises a further fast PLL;
the slow reference frame angle determination unit and the fast PLL are connected to the first infeed and used for controlling the rectifier current; and
the further fast PLL (220) is connected to the second infeed and used for controlling the inverter voltage.

13. The converter system according to claim 1, wherein the converter system is an uninterruptable power supply, UPS, system.

14. A method for operating a converter system, comprising:
providing a rectifier configured to receive a grid voltage;
providing a DC link stage configured to receive an output voltage of the rectifier and to provide a DC link voltage for an inverter;
wherein the inverter is configured to receive the DC link voltage from the DC link stage, and to generate an output voltage, and wherein the rectifier, the DC link stage and the inverter are connected in series; and
providing a control unit, the control unit operating to:
generate a slow reference frame angle $\theta_{r,slow}$ using a slow reference frame angle determination unit, the slow reference frame angle $\theta_{r,slow}$ representing an angle that is slowly following a grid phase deviation; and
generate a fast reference frame angle $\theta_{r,fast}$ representing an angle that is fast following a grid phase deviation using a fast Phase Locked Loop, PLL; and
use the slow reference frame angle $\theta_{r,slow}$ and the fast reference frame angle $\theta_{r,fast}$ to control a rectifier output current, and to use the fast reference frame angle $\theta_{r,fast}$ to control the inverter output voltage and to synchronize the inverter output voltage with the grid voltage.

15. The method of claim 14, wherein the slow reference frame angle determination unit is a slow PLL, and wherein the slow PLL has a smaller bandwidth than the fast PLL.

16. The method of claim 14, wherein the slow reference frame angle determination unit derives the slow reference frame angle $\theta_{r,slow}$ from the fast reference frame angle $\theta_{r,fast}$.

17. The method according to claim 14, wherein the control unit further operates to:
transform the grid voltage $V_{pcc}$ into a slow reference frame voltage $V_{pcc\ slow}$, wherein the transformation is a Park transformation using the slow reference frame angle $\theta_{r,slow}$; and
transform the grid voltage $V_{pcc}$ into a fast reference frame voltage $V_{pcc\ fast}$, wherein the transformation is a Park transformation using the fast reference frame angle $\theta_{r,fast}$; and
wherein the slow reference frame voltage $V_{pcc\ slow}$ is used to calculate a virtual synchronous machine reference current $I_{VSM,r}$;
wherein the virtual synchronous machine reference current $I_{VSM,r}$ is a further component for controlling rectifier output current; and
wherein the fast reference frame voltage $V_{pcc\ fast}$ is a further component for controlling the inverter output voltage.

18. The method of claim 17, wherein the virtual synchronous machine reference current $I_{VSM,r}$ is obtained by applying a virtual admittance to the slow reference frame voltage $V_{pcc\ slow}$ resulting in a virtual synchronous machine current $I_{VSM}$ and by rotating the virtual synchronous machine current $I_{VSM}$ by an angle difference between $\theta_{r,slow}$ and $\theta_{r,fast}$.

19. The method according to claim 14, further comprising an inverter voltage control unit that operates to calculate an output voltage $V_{inv}$ for controlling the inverter output voltage, wherein the output voltage $V_{inv}$ is controlled to an input reference voltage $V_{ref}$ and to the reference frame angle $\theta_{r,fast}$.

20. The method according to claim 19, wherein the inverter voltage control unit is further configured to perform the inverse Park transformation of the inverter output voltage $V_{inv}$ using the fast reference frame angle $\theta_{r,fast}$.

* * * * *